United States Patent [19]
Chen

[11] Patent Number: 5,267,266
[45] Date of Patent: Nov. 30, 1993

[54] FAST CONVERGING ADAPTIVE EQUALIZER USING PILOT ADAPTIVE FILTERS

[75] Inventor: Walter Y. Chen, Brookside, N.J.

[73] Assignee: Bell Communications Research, Inc., Livingston, N.J.

[21] Appl. No.: 881,046

[22] Filed: May 11, 1992

[51] Int. Cl.$^5$ .............................................. H03H 7/30
[52] U.S. Cl. ..................................... 375/14; 375/103; 364/724.2
[58] Field of Search ........................ 375/11, 12, 13, 14, 375/99, 103; 333/28 R, 18; 364/724.19, 724.2

[56] References Cited

U.S. PATENT DOCUMENTS

| | | | |
|---|---|---|---|
| 4,633,482 | 12/1986 | Sari | 333/18 |
| 4,727,543 | 2/1988 | Bauer | 375/14 |
| 5,068,875 | 11/1991 | Quintin | 375/14 |
| 5,111,481 | 5/1992 | Chen et al. | 375/103 |

OTHER PUBLICATIONS

"Recursive Fixed-Order Covariance Least-Squares Algorithms", M. L. Honig, Bell System Technical Journal, vol. 62, No. 10, Dec. 1983, pp. 2961-2988.

"Adaptive Pilot Filtering for LMS Algorithm", W. Y. Chen, IEEE ICASSP, May 14-17, 1991 Proceedings.

Primary Examiner—Stephen Chin
Attorney, Agent, or Firm—Leonard Charles Suchyta; Joseph Giordano

[57] ABSTRACT

A fast converging adaptive equalizer and method for for improving the convergence speed of an LMS adaptive equalizer by whitening both the received and conditioning signals using pilot filters.

15 Claims, 5 Drawing Sheets

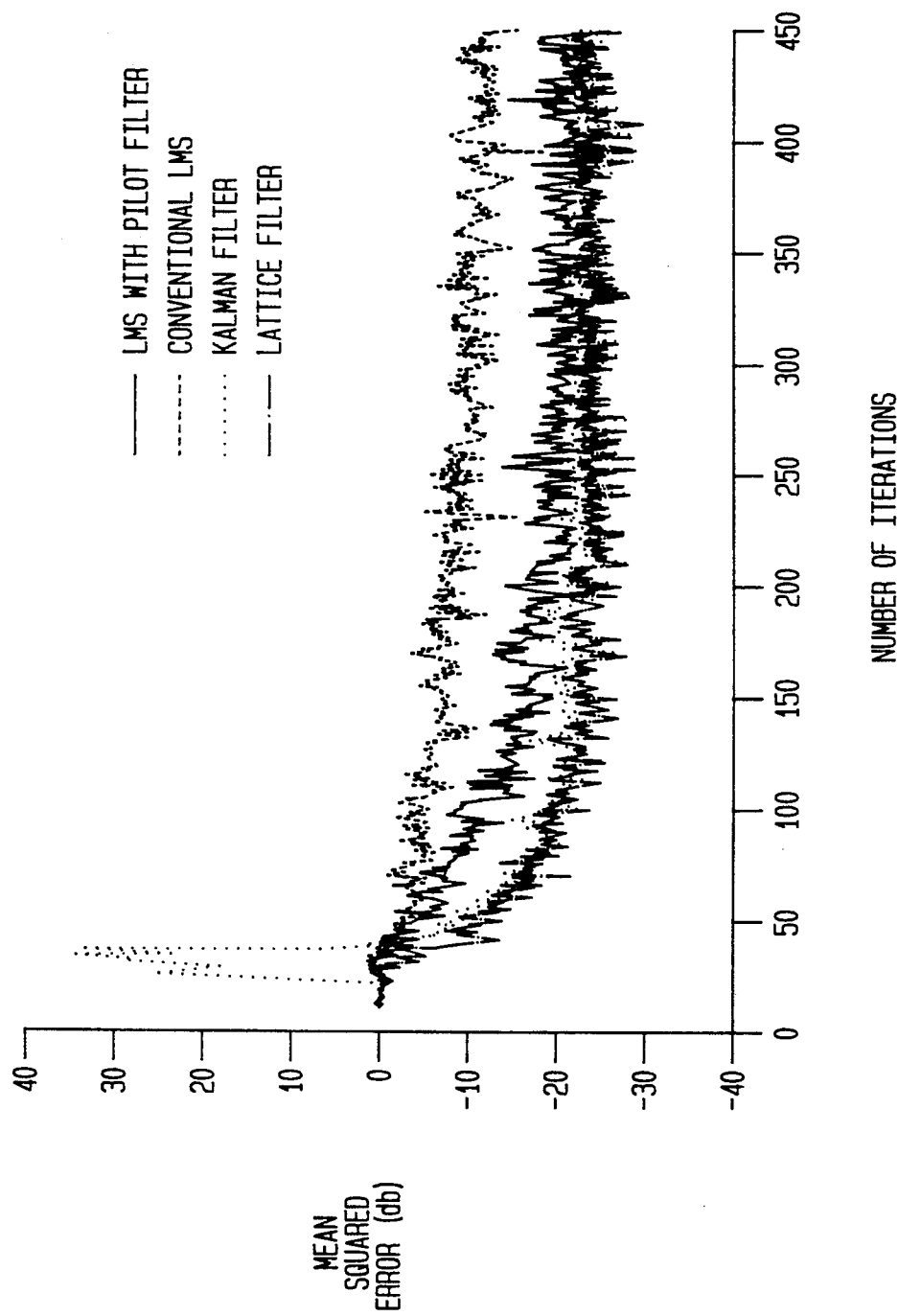

FAST CONVERGING ADAPTIVE EQUALIZER USING PILOT ADAPTIVE FILTERS

FIELD OF THE INVENTION

The present invention relates to adaptive equalizers and more specifically to a fast converging Least Mean Squared (LMS) adaptive equalizer and a method for improving the convergence speed of a LMS adaptive equalizer while reducing the signal processing requirements.

BACKGROUND OF THE INVENTION

An equalizer is a filter that removes from a received signal the amplitude and phase distortions that result from the frequency dependent time-variant response of the transmission channel. The objective of an equalizer is to process a received signal and output a representation of the original transmitted signal. Equalizers effect this result by emulating the transfer function of the transmission channel and applying the inverse of the transfer function to the received signal so as to remove the distortion. The equalizer isolates the data symbols of the received signal and and corrects the associated time dependent distortion affects. However to design an equalizer to work as described, the transfer function of the transmission channel must be known and stable; in application neither is true. Therefore, equalizers have been developed that learn the transfer function of the transmission channel. These equalizers are known in the art as adaptive equalizers.

There are two important measures of performance to consider in adaptive equalizer design, the speed of adaption and the accuracy of the learned transfer function. Generally there is a trade-off between these two criteria. To achieve a more accurate transfer function requires a longer adaption period. The penalty for a longer adaption period is a communications channel that remains closed while the equalizer is adapting. For the first equalizer applications, the accuracy of the adaption algorithm was critical, with the speed of convergence less so. The reason was the transmission speeds employed were limited and therefore the frequencies to be equalized were limited and the required convergence calculations were not a problem. New transmission technologies operate at greater transmission speeds requiring higher bandwidths which result in ever more complex filters with ever longer convergence times. Therefore, the speed of convergence becomes a design issue. The method of convergence, "convergence algorithm", has a significant impact on convergence time.

A conventional algorithm such as the Least Mean Squared (LMS) algorithm takes hundreds of iterations to converge although it is easy to implement and robust. Other convergence algorithms exists that are capable of converging in fewer iterations but they are computationally intensive for each iteration, and therefore expensive to implement. As a result the LMS algorithm has been used for many practical applications.

The convergence property of adoptive algorithms has been studied using vector space theory in the context of some fast algorithms by M. L. Honig ("Recursive fixed-order covariance Least-Squares algorithms," Bell System Technical Journal, vol. 62 No. 10, pp 2961-2992, December 1983). It was found there that the convergence speed depends on the ratio of the maximum to minimum eigenvalues of the received signal's autocorrelation matrix. The eigenvalue spread is minimized when the received signal is white and therefore the ratio of the maximum to minimum eigenvalues approach one. As the ratio approaches one, the speed of convergence increases. Most existing fast algorithms apply a signal whitening process only to the received signal but not to the original signal, or equivalently, to the decision output for the equalizing application.

For the LMS algorithm the convergence speed is fastest when the received signal is white. If the received signal is not white other fast algorithms, such as the Kalman or Lattice, which effectively perform received signal whitening during convergence can be used. However, these algorithms are complex and expensive to implement.

Therefore, in view of the foregoing it is an object of the present invention to provide a method and apparatus to increase the convergence speed of an adaptive filter employing the Least Mean Squared algorithm.

SUMMARY OF THE INVENTION

The invention disclosed herein is an apparatus and method for improving the convergence speed of the LMS algorithm by whitening both the received and original signal using pilot adaptive filters. A pilot adaptive filter with a very few filter coefficients emulates a short Wiener filter which is known to whiten a signal. An adaptive pilot filter with only a few filter coefficients converges quickly. Hence, my invention is to use a very short LMS adaptive filter to quickly identify a Wiener filter, which I call the pilot adaptive filter, and use these filters to filter both the received and original signals to whiten the signal and therefore increase the speed of convergence of the main adaptive filter.

BRIEF DESCRIPTION OF THE DRAWINGS

FIG. 6 depicts a graph comparing the simulated performance of my inventive equalizer to other known convergence algorithms for a signal distorted by a typical telephone channel.

DETAILED DESCRIPTION

Figure 1:
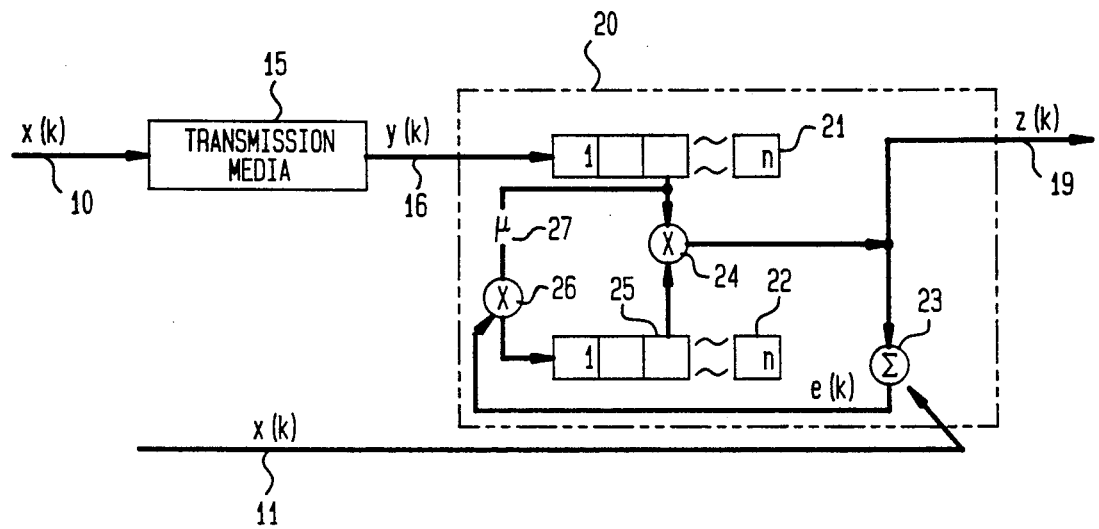
FIG. 1 illustrates a functional model of prior art equalizers.

A functional diagram for a prior art adaptive equalizer is shown in FIG. 1. A signal x(k) 10 is transmitted through a transmission channel 15 where it is distorted by the channel and results in signal y(k) 16. Signal y(k) 16 is filtered through an adaptive filter 20 to correct the signal and produce a signal z(k) 19 that best approximates x(k) 10. The adaptive filter 20 comprises a shift register 21 and a non-shift register 22 both of which are of length n. The shift register 21 stores the last n data symbols of signal y(k) 16. The non-shift register 22 stores the n values for the filter coefficients $W_i$ of a digital filter forming the adaptive equalizer. The equalizer operates a follows. The output z(k) 19 of the filter 20 is inverted and added to the original signal or a replica of the original signal x(k) 11 at a summation circuit 23. This original signal input to the summation circuit is called in the art the conditioning input. The sum of the conditioning input and an inverted z(k) results in an error signal e(k) 25. This error signal e(k) 25 is multiplied by a multiplier 26 with the product of the received data vector $Y_k$ of received signal y(k) and a scalar multiple v, shown as scalar multiplier 27. The output of multiplier 26 is added to vector $W_k$ stored in non-shift register 22 as vector $W_{k+1}$. The new values for the filter coefficients $W_{k+1}$ are multiplied with the received signal vector $Y_{k+1}$ in multiplier 24 to produce a new output signal z(k). This process is iteratively repeated.

In general, the output of a channel equalizer is $$z(k) = W_k^T Y_k = \sum_{j=1} w_j y(k-j+1) \qquad 1$$

where $W_k$ is a vector of filter coefficient values for the equalizer. For adaptive equalizers the elements of $W_k$ must be iteratively updated where $$W_{k+1} = W_k + \mu Y_k(x(k) - W_k Y_k). \qquad 2$$

The performance of a LMS equalizer is characterized by its mean square error (MSE)

$$\epsilon = E[(x(k) - z(k))^2]. \qquad 3$$

The objective of the adaptive equalizer is to minimize the MSE thereby converging on a set of filter coefficients $W_n$ that result in producing a z(k) that best approximates x(k). The MSE decreases as the number of iterations k increases until a minimum MSE level is related to the length n of the equalizer and the scalar step size $\mu$. It is the step size $\mu$ that effects the time for convergence of the equalizer. A small step size requires a longer convergence time. With a larger step size, the stability of the equalizer is reduced along with an increase in the MSE.

Figure 2:
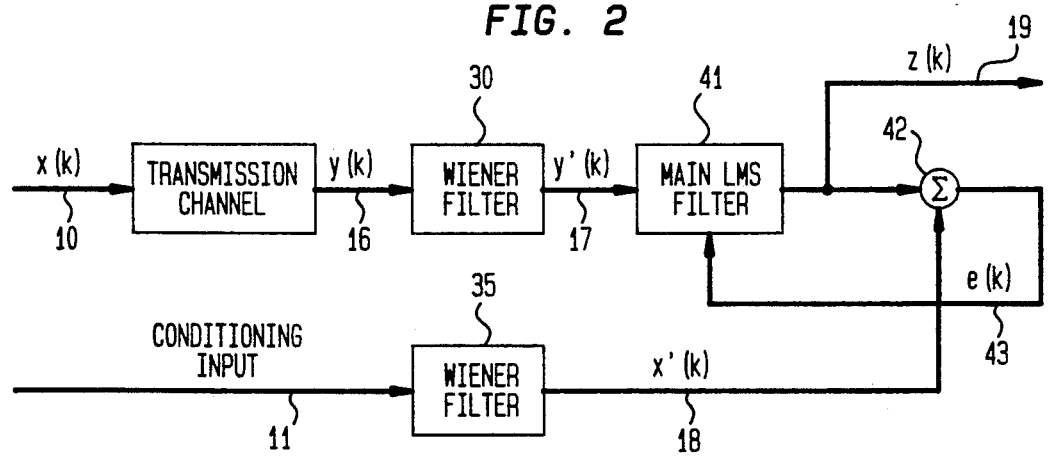
FIG. 2 illustrates an embodiment of my inventive equalizer employing pilot Wiener filters.

For the LMS algorithm the convergence speed is the fastest when the received signal is white. If the received signal is not white, other fast algorithms, such as the Kalman or Lattice algorithms which effectively perform received signal whitening during convergence, are used to increase convergence speed. Because an optimum Wiener filter can be used to whiten a signal, one aspect of my invention is to whiten both the received and conditioning input signals prior to filtering through the main LMS adaptive filter; FIG. 2 broadly illustrates such an arrangement. Signal x(k) 10 is transmitted through transmission channel 15 where a distorted version of x(k) is outputted as signal y(k) 16. The signal y(k) 16 is filtered through a Wiener filter 30 to produce y'(k) 17, a whitened version of y(k). The original signal x(k) 10 or a replica of the original signal (i.e. the conditioning input) 11 is filtered through another Wiener filter 35 identical to the first Wiener filter 30 to produce a whitened version x'(k) 18 of the original signal x(k) 10. The whitened received signal y'(k) 17 is provided as input to the main LMS adaptive filter 41. The output of the main LMS adaptive filter 41 is compared in comparator 42 to x'(k), the whitened original signal. Comparator 42 determines the differences between y'(k) and x'(k) and produces an error signal e(k) 43 which is provided as feedback to the main adaptive LMS filter 41 where the LMS algorithm is used to adjust the filter coefficients until they converge on values that best minimize the error signal e(k) 43.

The inventive equalizer hereto described can be used in practical application only when the transfer characteristics of the transfer channel are known and the optimum Weiner filter can therefore be determined. It is a second aspect of my invention to use adaptive LMS filters with a limited number of filter coefficients in place of the Wiener filters. I call these adaptive filters pilot adaptive filters. The name is drawn to an analogy we see in the field of parachuting. Main parachutes are large and take time to stabilize. Hence, people use a pilot parachute to open the main parachute and to pull the main parachute to full length to gain a much quicker stabilization. In my invention, the pilot adaptive filter stabilizes quickly to whiten the signal thereby providing quicker stabilization of the main adaptive equalizer. This advantageous result rests on two principles. The first is that the convergence speed of a short adaptive filter is much faster than a longer one. The second is that a relatively short adaptive filter will converge to identify an optimum Wiener filter and substantially whiten a signal. Applying this second aspect of my invention to the structure described above and shown in FIG. 2 results in the equalizer shown in FIG. 3.

Figure 3:
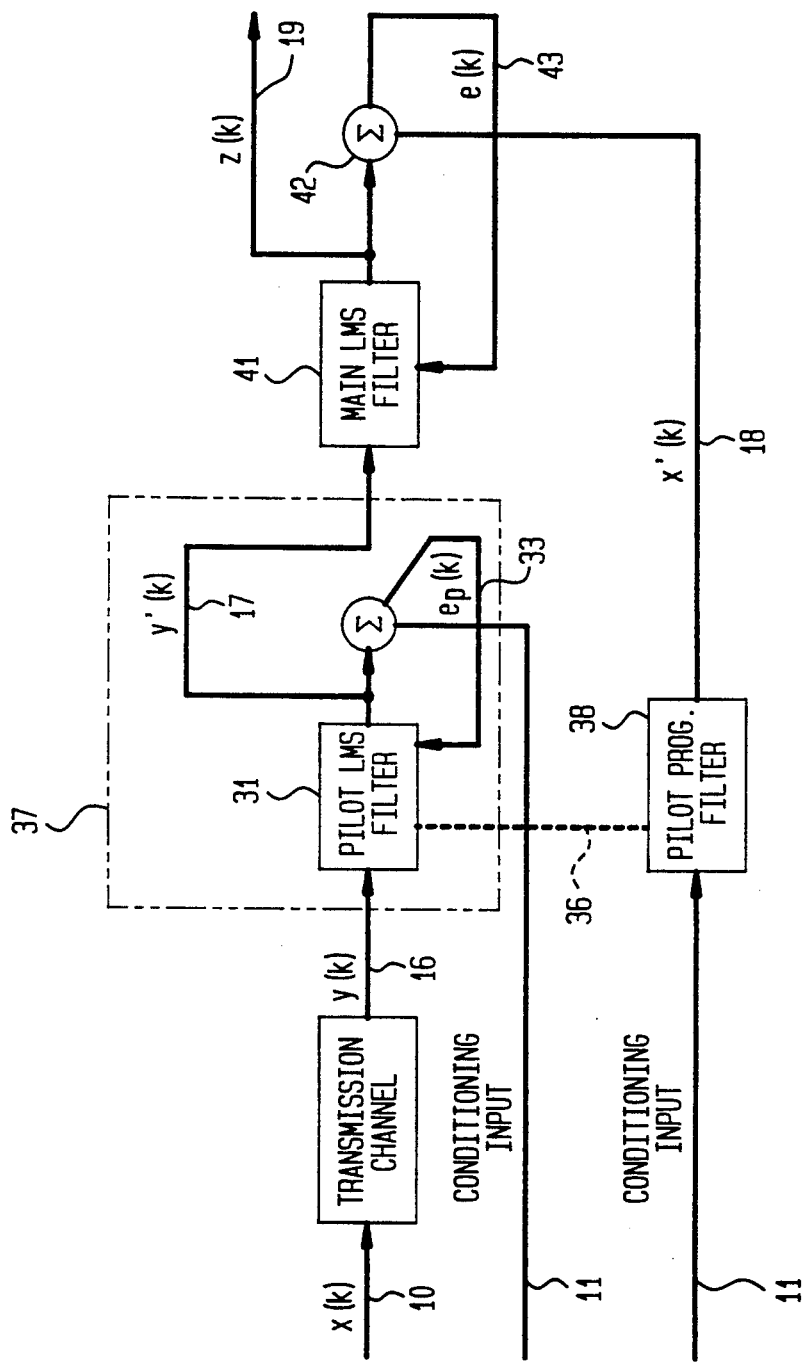
FIG. 3 illustrates an embodiment of my my inventive equalizer employing pilot adaptive filters in place of Wiener filters.

In the structure shown in FIG. 3, a pilot adaptive filter 37 replaces Wiener filter 30 and pilot programmable filter 38 replaces Wiener filter 35. When signal x(k) 10 is transmitted through transmission channel 15 a distorted version of x(k) is outputted as signal y(k) 16. The signal y(k) 16 is then filtered through pilot adaptive filter 37 instead of Wiener filter 30. Pilot adaptive filter 37 is composed of LMS adaptive filter 31 and inverting and summation circuit 32. Signal y(k) is filtered through the LMS adaptive filter 31 and outputted to the inverting and summation circuit 32 in addition to the main adaptive filter 40. A conditioning signal x(k) 11 is also provided as input to the inverting and summation circuit 32. This inverting and summation circuit 32 sums the conditioning signal x(k) 11 to the inverse of the output of the pilot adaptive filter 31 to produce an error signal $e_p(k)$ 33 which is used as feedback to the pilot adaptive filter 31 to cause the filter coefficients to converge on values that minimize the error signal 33. The resultant values of the filter coefficients are also communicated to the programmable pilot adaptive filter 38 along communications path 36. Now, pilot adaptive filter 37 and pilot programmable filter 38 have become optimum Wiener filters. The signal y'(k) 17 is a whitened version of y(k), and x'(k) 18 is a whitened version of x(k) 10 and both of these whitened signals are input to the main adaptive filter 41 and summation circuit 42, respectively. Because the pilot adaptive filters have only a few filter coefficients they converge quickly, and because the main adaptive filter is receiving input that has been whitened by the pilot adaptive filters, it also converges more quickly than it would otherwise. Therefore, the performance of an adaptive equalizer that employs the LMS convergence algorithm is substantially improved.

Although the above described adaptive equalizer converges more quickly than typical LMS adaptive equalizers and is less computationally intensive than other fast adaptive equalizer, it is still substantially more computationally intensive than conventional prior art LMS adaptive equalizers because the values of the main adaptive filter coefficients are updated at each iteration of the pilot adaptive filter coefficients. However, only the stabilized values of the filter coefficients for the pilot adaptive filters are important. A third aspect of my invention is to eliminate the need to recalculate y'(k) and the filter coefficients of the main adaptive filter at each iteration of the pilot adaptive filters.

In my inventive structure illustrated in FIG. 3

$$W_{k+1} = W_k + \mu Y_k(x'(k) - W_k Y_k). \quad\quad 4$$

where,
$$x'(k) = P_k^T X_k \text{ and } Y_k = P_k^T Y_k. \quad\quad 5$$

$P_k$ is the vector of filter coefficient values for the pilot filters. Therefore, while the pilot adaptive filters are converging, at each iteration of the pilot filter a corresponding $Y'_i$ is calculated requiring $m \times m$ calculations (m is the number of filter delay lines in the pilot adaptive filters), for a total of $m \times m \times n$ calculations for the entire equalizer.

Figure 4:
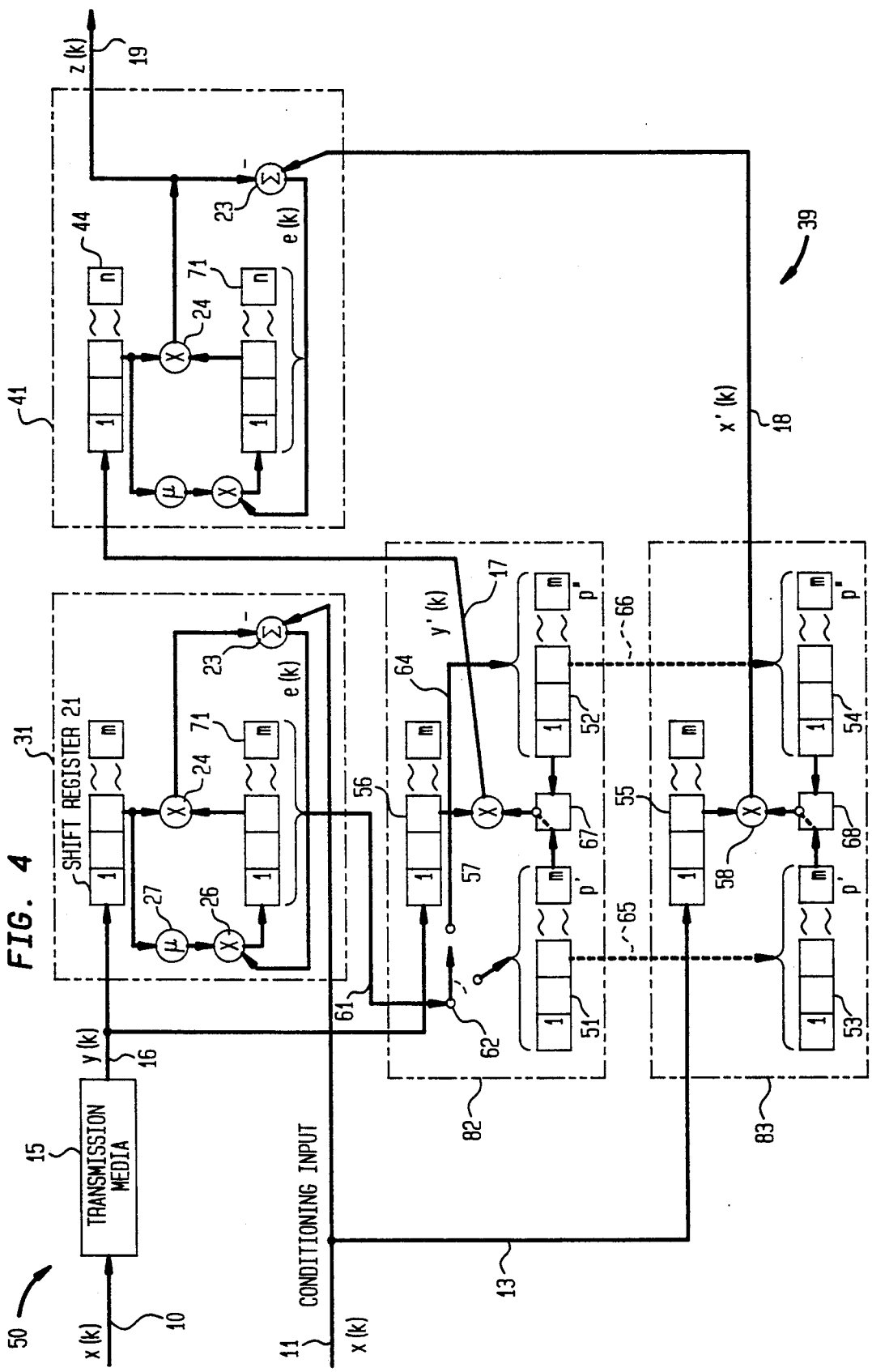
FIG. 4 illustrates an efficient pilot adaptive equalizer in accordance with my invention.

FIG. 4 illustrates a more efficient adaptive equalizer in accordance with my invention. Transmitted signal x(k) 10 is transmitted through transmission channel 15 which distorts the signal and produces a signal y(k) 16. Signal y(k) 16 is received by my inventive equalizer 50. My adaptive equalizer 50 is comprised of a LMS pilot adaptive filter 31, a main LMS adaptive filter 41, and two pilot programmable filters 82 and 83. The distorted received signal y(k) 16 is input to pilot adaptive filter 31 where it is processed. The pilot adaptive filter, at each iteration, updates the m filter coefficients in non-shift register 71 according to the typical adaptive filtering process described earlier. Distorted signal y(k) 16 is also input into pilot programmable filter 82 and stored in shift register 56. The m filter coefficients that are iteratively created in pilot adaptive filter 31 are communicated via lead 61 to switch means 62 which is alternately connected to non-shift registers 51 or 52 at regular intervals to update the m filter coefficients therein. While the filter coefficients are being updated in one non-shift register the other non-shift register is connected to multiplier circuit 57 and multiplied with the signal stored in shift register 56 to produce a new signal y'(k) 17. Signal y'(k) 17 is input to LMS main adaptive filter 41 and stored in shift register 44. For illustrative purposes as shown in FIG. 4, a switch 62 connects lead 61 to lead 64 to update the filter coefficients in non-shift register 52 while switch means 67 connects non-shift register 51 to multiplier circuit 57. At iterations that are some odd multiple of the number of filter coefficients in the LMS main adaptive equalizer 41, both switches 62 and 67 would switch. Switch 62 would connect lead 61 to lead 63 to update the values of the filter coefficients in non-shift register 51 while switch 67 would connect non-shift register 52 to multiplier circuit 57. At some even multiple of the number of filter coefficients in LMS main adaptive filter 40, both switches 62 and 67 would revert back to the previous connections.

Conditioning input x(k) 11 is processed similarly. Signal x(k) is provided as input to pilot programmable filter 83 along path 13 and it is stored in shift register 55. The m filter coefficients in non-shift registers 53 and 54 are updated alternately, concurrently with the update of non-shift registers 51 and 52 along communications paths 65 and 66. While one non-shift register is being updated, the values of the filter coefficients in the other non-shift register are multipled with the signal stored in shift register 55 at multiplier circuit 58. Similar to switch circuit 67 in programmable filter 82, switch circuit 68 in programmable filter 83 alternately connects non-shift registers 53 and 54 to multiplier 58. The switching of switching circuit 68 occurs concurrently with that of switching circuit 67. The product is signal x'(k) 18 which is provided as conditioning input to the LMS main adaptive filter 41 along lead 39. LMS main adaptive filter 42 processes signal y'(k) 17 according to the conventional adaptive equalizing process described earlier using x'(k) 18 as the conditioning input.

The benefit of my efficient adaptive equalizer is that the number of computations required at each iteration of the pilot adaptive filter is reduced. We still have $$W_{k+1} = W_k + \mu Y_k(x'(k) - W_k Y_k)$$

However, we have $$y'(k) = P'^T_k Y_k \text{ and } x'(k) = P'^T_k X_k \quad\quad 6$$

for $(2i)n < k < (2i+1)n$ and $$y'(k) = P'^T_k Y_k \text{ and } x'(k) = P'^T_k X_k \quad\quad 7$$

for $(2i+1)n < k < 2(i+1)n$. We still update $P_k$ at every iteration $$P_{k+1} = P_k + u Y_k(x(k) - P_k^T Y_k) \quad\quad 8$$

and $P_k' = P_k$ only when $k = (2i)n$ and $P_k'' = P_k$ only when $k = 2(i+1)n$. As a result, the multiplication required by this simplified adaptive pilot filtering algorithm is 4 m; 2 m for calculating $Y_k'$ and 2 m for calculating $X'_k$. The total calculation for my adaptive equalizer is 4 m for the pilot filter and 2 n for the main adaptive filter. This compares favorably against other first convergence algorithms. As an example, a farst transversal filter would converge requiring 7 n calculations. Therefore with m less than n, my inventive equalizer is less computationally intensive than an equalizer with a fast transversal filter.

An adaptive pilot filter with m filter coefficients converges much faster compared with a main adaptive filter with n filter coefficients, where m<n. The increase in convergence speed comes from two factors. The first is that the pilot adaptive filter has a smaller ratio of the maximum to minimum eigenvalues of the autocorrelation matrix $$\frac{\lambda_{max}}{\lambda_{min}}.$$

Second is that the scalar multiplier $\mu$ could be bigger for the pilot filter than for the main filter allowing the pilot filter itself to converge more quickly. When the pilot adaptive filter whitens the signal it de-correlators the eigenvalues of the signal processed in the main adaptive filter. By lowering the ratio of the eigenvalues of the signal processed in the main filter, the convergence speed of the main filter is therefore improved.

Figure 5:
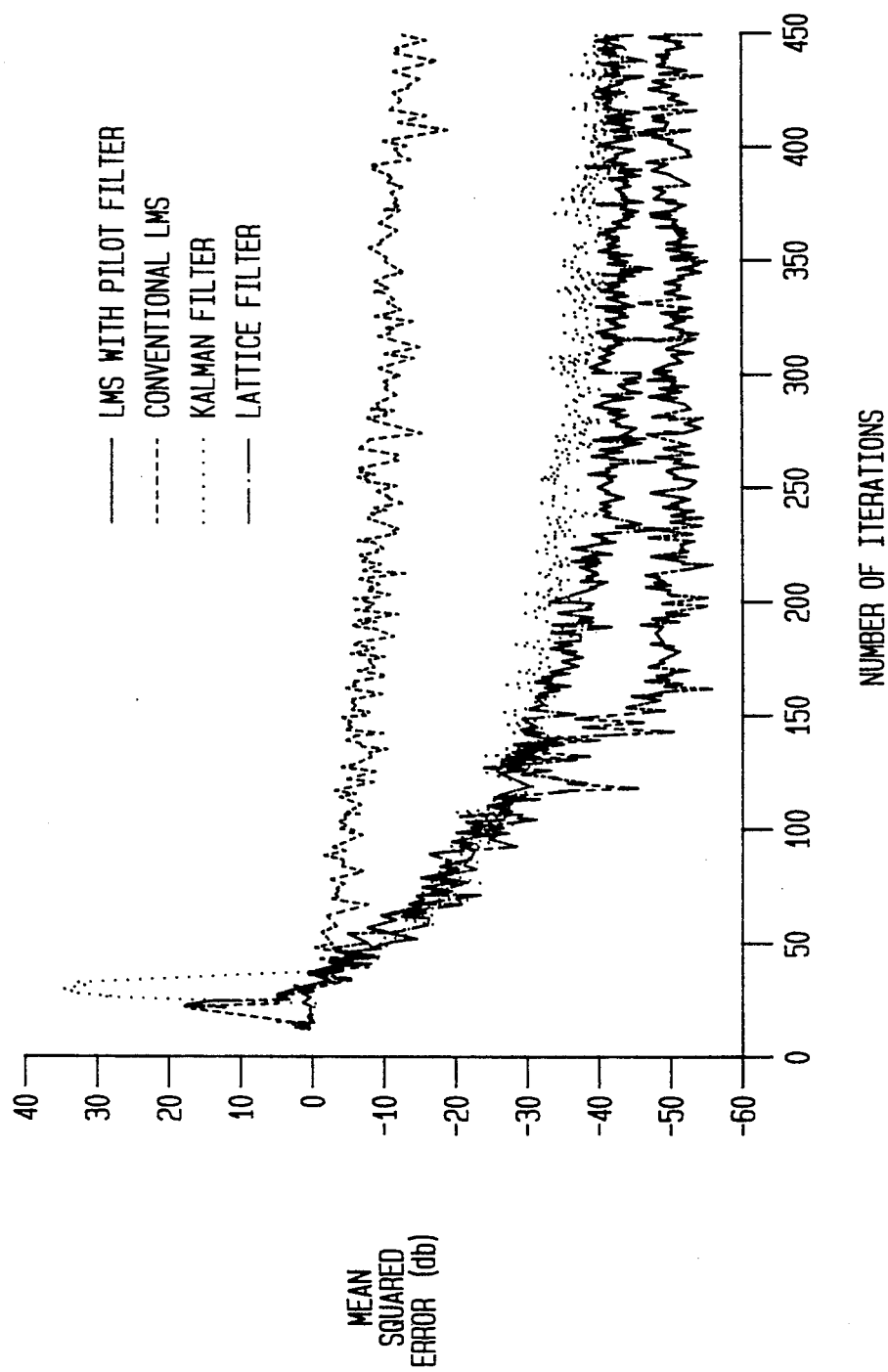
FIG. 5 depicts a graph comparing the simulated performance of my inventive equalizer to other known convergence algorithms for a signal distorted by a raised cosine function.

The performance of my inventive equalizer was evaluated under two situations using computer simulation. For the first case a raised cosine function was used to model the channel. For the second case a typical telephone channel impulse response was used. The performance of my adaptive pilot filtering equalizer was simulated against equalizers employing the Kalman algorithm, the Lattice Gradient algorithm, and the conventional LMS algorithm. FIG. 5 compares the performance of my efficient adaptive equilizer against those of other typical equalizers for a signal distorted by a raised cosine channel. FIG. 6 compares the performance of my efficient adaptive equalizer against other typical equalizers for a signal distorted by a typical telephone channel. As these figures show my inventive adaptive equalizer 101 reduces its mean squared error in fewer iterations than equalizers using Kalman and Lattice algorithms for the raised cosine channel and also performs closely to those optimal algorithms for a telephone channel model.

Clearly, those skilled in the art recognize that the principles that define my inventive equalizer are not limited to the embodiments illustrated herein. Other embodiments may be readily devised by those skilled in the art.

What is claimed is:

1. A fast convergence adaptive equalizer responsive to a received signal from a transmission channel and a conditioning signal from the transmission channel or another conditioning signal source and comprising:
    a main adaptive filter for removing the time dependent distortion effects of the transmission channel from the received signal, said main adaptive filter having filter coefficients with values that change responsive to the received and the conditioning signals;
    a first filter means interposed between the transmission channel and said main adaptive filter for whitening the received signal before said received signal is processed by said main adaptive filter; and
    a second filter means connected to said main adaptive filter and responsive to the conditioning signal for whitening the conditioning signal before said conditioning signal is processed by said main adaptive filter.

2. A fast convergence adaptive equalizer in accordance with claim 1 wherein said first and second filters have fewer filter coefficients the said main adaptive filter.

3. A fast convergence adaptive equalizer as recited in claim 1 wherein said main adaptive filter uses the least means squared algorithm for adjusting said filter coefficients.

4. A fast convergence adaptive equalizer as recited in claim 3 wherein said first filter means comprises an adaptive filter employing the least means squared algorithm and having fewer filter coefficients than said main adaptive filter;
    wherein said second filter means comprises a programmable filter having the same number of filter coefficients as said first filter means; and
    further comprising means for communicating the values of the filter coefficients from said first filter means to set the filter coefficients of said second filter means.

5. A fast convergence adaptive equalizer as recited in claim 3 wherein said first filter means is a first programmable filter having two sets of filter coefficients and said second filter means is a second programmable filter also having two sets of filter coefficients; and further comprising
    a pilot LMS adaptive filter connected to the transmission channel and having fewer filter coefficients than said main adaptive filter for filtering said received signal to determine filter coefficient values; and
    communication means for communicating the values of said filter coefficients from said pilot LMS adaptive filter to each of said first and second filter means.

6. A fast convergence adaptive equalizer as recited in claim 5 wherein said the values of the first of said two sets of said filter coefficients in said first filter means are updated via said communication means while the second set of said filter coefficients are being used to filter the received signal, and said the values of the first of said two sets of said filter coefficients in said second filter means are updated via said communication means while the second set of said filter coefficients in said second filter means are being used to filter the conditioning signal.

7. A fast convergence adaptive equalizer as recited in claim 6 wherein said communication means comprises switching means for alternately updating one set of said two sets of said filter coefficients of said first and second filter means at regular intervals.

8. A method for improving the rate of convergence for a main adaptive equalizer having a main adaptive filter employing the least mean squared algorithm and responsive to a received signal from a transmission channel and a conditioning signal, said method comprising the steps of:
    filtering the received signal to whiten the received signal prior to the signal being processed in said main adaptive filter;
    filtering the conditioning signal to whiten said conditioning signal prior to the signal being processed in said main adaptive filter; and
    processing said whitened received signal using said whitened conditioning signal in said main adaptive filter wherein said whitened signals cause the main adaptive filter to converge more quickly to the appropriate values for its filter coefficients.

9. The method as recited in claim 8 wherein said steps of filtering the received signal and the conditioning signal comprise applying these signals to filters with fewer coefficients than the main adaptive equalizer.

10. The method as recited in claim 8 wherein said step of filtering the received signal comprises:
    processing the received signal through a pilot adaptive filter to determine filter coefficient values;
    communicating said filter coefficient values to a first non-shift register in a first programmable filter;
    filtering the received signal through said first programmable filter using coefficient values in a second non-shift register;
    switching said communicating of said filter coefficient values from said first non-shift register to said second non-shift while concurrently shifting the filtering of the received signal from using said values in said second non-shift register to using said values in said first non-shift register;
    switching back said communicating of said filter coefficient values from said second non-shift register to said first non-shift register while concurrently shifting the filtering of the received signal from using said values in said first non-shift register to using said values in said second non-shift register; and
    repeating said switching and switching back steps at periodic intervals.

11. The method as recited in claim 10 wherein said step of filtering the conditioning signal comprises the steps of:

filtering the conditioning signal through a second programmable filter having two non-shift registers using the coefficient values in said second non-shift register;

communicating said coefficient values to the first of said non-shift registers of said second programmable filter concurrently with said communication of said coefficient values to said first non-shift register of said first programmable filter; and switching in said second programmable filter, coincident with said step of switching said communicating of said filter coefficients in said first programmable filter, said updating of said filter coefficient values from said first non-shift register to said second non-shift register while concurrently shifting the filtering of said conditioning signal from using said values in said second non-shift register to using said values in said first non-shift register; and switching back in said second programmable filter, coincident with said step of switching back said communicating of said filter coefficients in said first programmable filter, said communicating of said filter coefficient values from said second non-shift register to said first non-shift register while concurrently shifting the filtering of the received signal from using said values in said first non-shift register to using said values in said second non-shift register.

12. A fast converging least mean squared (LMS) adaptive equalizer for connection to a transmission channel and comprising:

a main least mean squared (LMS) adaptive filter;

a first pilot filter for whitening a received signal for the transmission channel before the received signal is provided as input to said main LMS adaptive filter, said first pilot filter serially connected between the transmission channel and said main LMS adaptive filter and said first pilot filter having fewer filter coefficients than said main adaptive filter; and a second pilot filter for whitening a conditioning signal before the conditioning signal is provided as the conditioning to said main LMS adaptive filter, said second pilot filter connected to said main LMS adaptive filter and responsive to the conditioning signal.

13. A fast converging LMS adaptive equalizer as recited in claim 12 wherein said first and second pilot filters are Weiner filters.

14. A fast converging LMS adaptive equalizer as recited in claim 12 wherein said first pilot adaptive filter is a LMS adaptive filter and said second pilot adaptive filter is a programmable filter, further comprising:

communications means for communicating filter coefficient values from said first pilot filter to said programmable filter.

15. A fast converging least mean squared (LMS) adaptive equalizer as recited in claim 11 further comprising:

an LMS adaptive filter having the same number of filter coefficients as said first and second pilot filters and connected in parallel with said first and second pilot filters also to receive the received signal from said transmission channel;

communication means connected between said LMS adaptive filter and said first and second pilot filters for communicating the values of the filter coefficients determined in said LMS adaptive filter to said first and second pilot filters and wherein said first and second pilot filters are programmable filters each having two non-shift registers, with a first non-shift register active in the filtering process and a second non-shift register being updated with new filter coefficient values from said communication means;

first switching means for switching the connection of said communication means from said second non-shift register to said first non-shift register; and second switching means contained within each of said first and second pilot filters and synchronized with said first switching means for making active said second non-shift register for the filtering process and for making inactive said first non-shift register.

* * * * *